(12) United States Patent
Wang et al.

(10) Patent No.: US 9,653,417 B2
(45) Date of Patent: May 16, 2017

(54) METHOD FOR SINGULATING PACKAGED INTEGRATED CIRCUITS AND RESULTING STRUCTURES

(71) Applicant: Taiwan Semiconductor Manufacturing Company, Ltd., Hsin-Chu (TW)

(72) Inventors: Yen-Ping Wang, Hemei Township (TW); Ming-Kai Liu, New Taipei (TW); Kai-Chiang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 21 days.

(21) Appl. No.: 14/074,293

(22) Filed: Nov. 7, 2013

(65) Prior Publication Data

US 2015/0125997 A1  May 7, 2015

(51) Int. Cl.
| | |
|---|---|
| *H01L 21/78* | (2006.01) |
| *H01L 21/782* | (2006.01) |
| *H01L 21/784* | (2006.01) |
| *H01L 21/82* | (2006.01) |
| *H01L 21/00* | (2006.01) |
| *H01L 23/00* | (2006.01) |
| *H01L 21/308* | (2006.01) |

(Continued)

(52) U.S. Cl.
CPC .......... *H01L 24/11* (2013.01); *H01L 21/3086* (2013.01); *H01L 21/78* (2013.01); *H01L 21/561* (2013.01); *H01L 23/3114* (2013.01); *H01L 24/03* (2013.01); *H01L 24/05* (2013.01); *H01L 24/13* (2013.01); *H01L 2224/05548* (2013.01); *H01L 2224/05567* (2013.01); *H01L 2224/1191* (2013.01); *H01L 2224/131* (2013.01); *H01L 2224/13022* (2013.01); *H01L 2224/13024* (2013.01); *H01L 2224/13147* (2013.01); *H01L 2224/94* (2013.01); *H01L 2924/00014* (2013.01); *H01L 2924/181* (2013.01)

(58) Field of Classification Search
CPC ......... H01L 21/78; H01L 21/56; H01L 21/82; H01L 21/6836; H01L 21/563; H01L 21/28; H01L 21/3171; H01L 21/461; H01L 23/3178; H01L 21/782; H01L 21/784
USPC ................................. 438/113, 114, 460, 465
See application file for complete search history.

(56) References Cited

U.S. PATENT DOCUMENTS

| | | | |
|---|---|---|---|
| 5,882,986 A * | 3/1999 | Eng ..................... | H01L 21/3043 257/E21.238 |
| 6,987,054 B2 * | 1/2006 | Fukasawa et al. ............ | 438/465 |

(Continued)

*Primary Examiner* — David Zarneke
(74) *Attorney, Agent, or Firm* — Slater Matsil, LLP

(57) ABSTRACT

A method of packaging an integrated circuit includes forming a first integrated circuit and a second integrated circuit on a wafer, the first and second integrated circuit separated by a singulation region. The method includes covering the first and second integrated circuits with a molding compound, and sawing through the molding compound and a top portion of the wafer using a beveled saw blade, while leaving a bottom portion of the wafer remaining. The method further includes sawing through the bottom portion of the wafer using a second saw blade, the second saw blade having a thickness that is less than a thickness of the beveled saw blade. The resulting structure is within the scope of the present disclosure.

20 Claims, 4 Drawing Sheets

(51) Int. Cl.
*H01L 23/31* (2006.01)
*H01L 21/56* (2006.01)

(56) References Cited

U.S. PATENT DOCUMENTS

| | | | |
|---|---|---|---|
| 7,429,733 B2 * | 9/2008 | Schmidt | G01N 23/225 |
| | | | 216/39 |
| 8,298,963 B2 * | 10/2012 | Akiba | B28D 5/022 |
| | | | 257/773 |
| 9,472,481 B2 * | 10/2016 | Lin | H01L 21/565 |
| 2008/0006900 A1 * | 1/2008 | Chan | H01L 21/563 |
| | | | 257/499 |

* cited by examiner

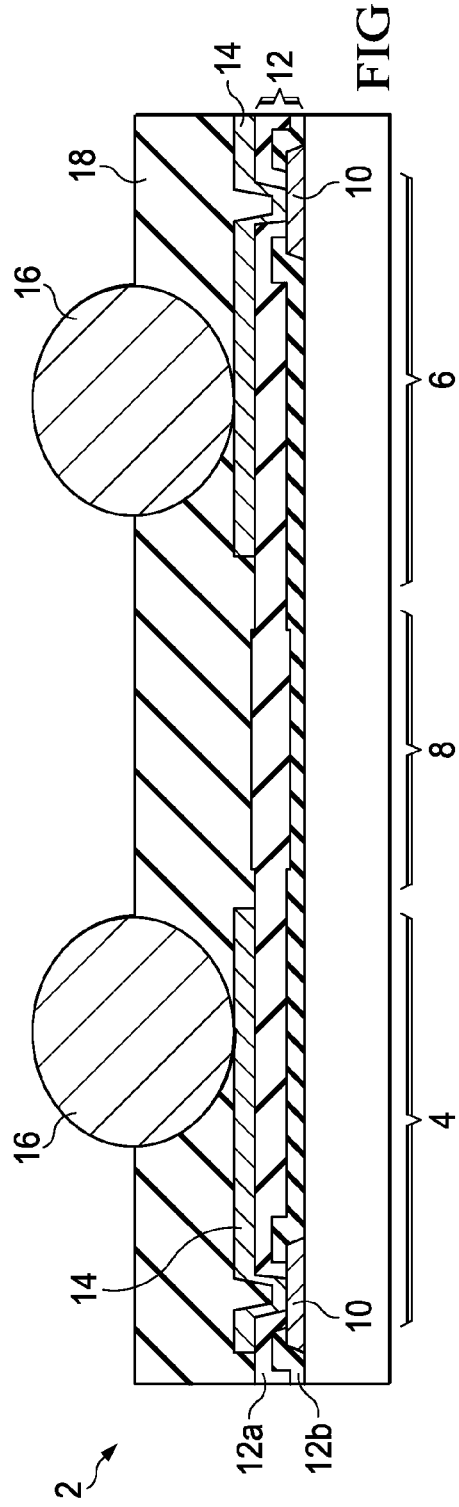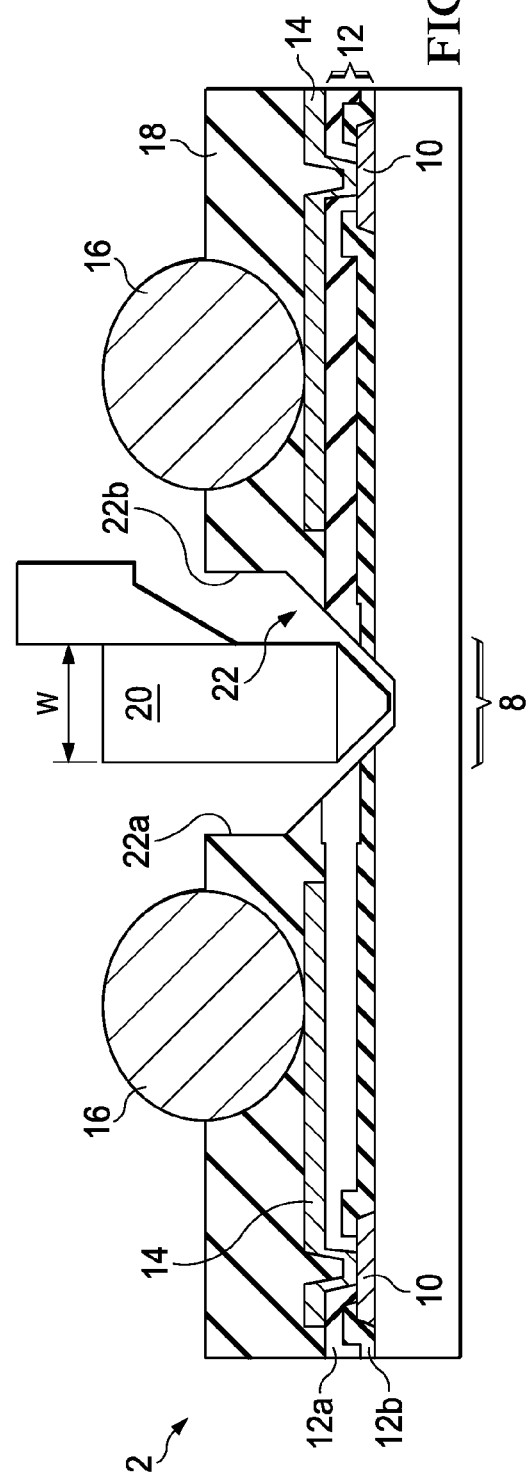

METHOD FOR SINGULATING PACKAGED INTEGRATED CIRCUITS AND RESULTING STRUCTURES

BACKGROUND

As the industry continues trending toward denser and denser integration of circuit and components, wafer level packaging is becoming increasingly employed. Multiple integrated circuit dies are manufactured on a common wafer, or substrate, and then packaged while still in wafer form. Packaging may include embedding the die in molding compound. After embedding, the individual die are singulated, e.g., by mechanically sawing through the molding compound and the wafer to singulate individual die. The singulation process can induce damage to the integrated circuit, however.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1-3 illustrate in cross-sectional view packaged integrated circuits formed on a common wafer in various stages of exemplary singulation processes;

DETAILED DESCRIPTION OF ILLUSTRATIVE EMBODIMENTS

Figure 3:
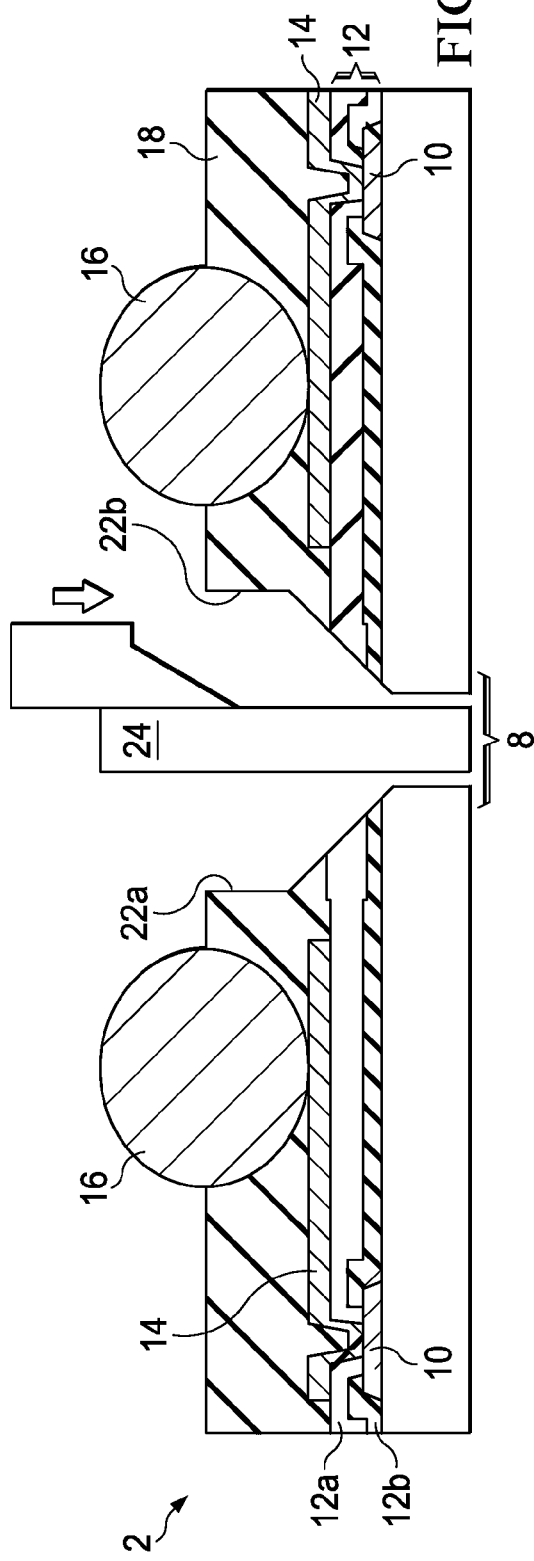

The making and forming of the present exemplary embodiments are discussed in detail below. It should be appreciated, however, that embodiments of the present disclosure provide many applicable concepts that can be embodied in a wide variety of specific contexts. The specific embodiments discussed are merely illustrative of specific ways to make and use the invention, and do not limit the scope of the applications.

The present disclosure will be described with respect to exemplary embodiments in a specific context, a method of singulating wafer scale packaged integrated circuit devices to minimize or avoid singulation induced damage.

FIG. 1 illustrates an exemplary structure 100 in cross sectional view. The structure includes wafer 2 in and upon which are formed first integrated circuit 4 and second integrated circuit 6. First integrated circuit 4 and second integrated circuit 6 are separated by scribe lines, also sometimes referred to herein as dicing lines and/or singulation regions 8. First integrated circuit 4 and second integrated circuit 6 are illustrated in a highly schematic and simplified form, as details beyond those illustrated are well known to those skilled in the art and are not necessary for an understanding of the present disclosure. For instance, although not illustrated, those skilled in the art will appreciate that first and/or second integrated circuit 4/6 will include doped regions and isolation regions formed within and/or upon wafer 2, polysilicon layers, and various metal layers and dielectric layers formed atop wafer 2.

An exemplary contact pad 10 is illustrated for each integrated circuit, although in practice numerous contact pads will be provided for each integrated circuit. A passivation layer 12 is formed atop the contact pads 10 with openings formed therein to allow electrical and/or physical contact therethrough to the respective contact pads 10. In some embodiments, passivation layer 12 is a multi-layer structure and may include two layers, 12a and 12b, as in the illustrated embodiment. A patterned redistribution layer 14, sometimes referred to as a post-passivation interconnect, is atop passivation layer 12. Respective portions of patterned redistribution layer 14 make electrical and/or physical contact respective contact pads 10. Connectors 16 are formed on respective portions of patterned redistribution layer 14. Connectors 16 may be solder balls, solder bumps, copper pillars, or structurally and functionally similar connectors.

In the illustrated embodiment, connectors 16 are formed directly on and physically contacting respective portions of patterned redistribution layer 14. In other embodiments, so-called under bump metal (UBM) could be employed between connectors 16 and respective portions of patterned redistribution layer 14. It is believed that the presently described embodiments are particularly advantageous in so-called UBM free fan-out processes. While not being limited to any particular theory underlying the operation of methods described herein, it is believed that the novel sawing methods described herein are particularly useful for minimizing or preventing mechanical damage that would otherwise result in a UBM free fan-out process.

Molding compound 18 is formed atop first and second integrated circuits 4, 6 and atop singulation regions 18. In some embodiments molding compound 18 is a liquid molding compound such as R4600-2C80, available from Nagase ChemteX Corporation, Osaka, Japan. As known in the art, liquid molding compound can be applied in a liquid form to uniformly and completely coat and cover a wafer surface. The liquid molding compound is then cured to harden, i.e. solidify, it. Curing can include one or more of a heat treatment, a radiation treatment (e.g., UV curing), a chemical curing step in which a reactant is applied to the liquid molding compound, exposure to an environment (e.g. air), or the like. The solid mold compound provides mechanical protection and electrical insulation to the underlying integrated circuits, as well as protecting the integrated circuits from environmental conditions, e.g., moisture or corrosive chemicals. Note that connectors 16 extend above a top surface of molding compound 18 in order to provide for electrical contact to connectors 16. This can be accomplished via numerous ways, including forming molding compound 18 to thickness that is less than the height of connectors 16, or forming molding compound to cover connectors 16 and removing a portion of molding compound 18, through a mechanical process, a chemical process, or a combined chemical and mechanical process, to expose top portions of connectors 16.

Note that no connectors 16 are formed in singulation regions 8. Preferably, no portions of patterned redistribution layer 12 are formed in singulation regions either. This is because these regions will be mechanically sawed through in order to singulate, i.e. physically separate, integrated circuits 4 and 6, as will be described further below.

As is known in the art, one of the final steps in some wafer level packaging schemes is to singulate the individual integrated circuits. This is commonly accomplished by mechanically sawing in the singulation region from a top major surface of the molding compound through to the bottom of the wafer in order to physically separate the various packaged integrated circuits formed on the common wafer into separate structures. It is further known, however, that the process of sawing through the molding compound and wafer (and various layers formed on the wafer) frequently causes damage such as chipping of the (typically silicon) wafer surface. Delamination between the top layers of the integrated circuit and the molding compound also frequently occurs as a result of the sawing process.

FIGS. 2 and 3 illustrate steps in a novel process for mechanically separating adjacent packed integrated circuits while minimizing or avoiding concomitant damage to the devices. FIG. 2 illustrates the structure of FIG. 1, again in cross-sectional view, during a first sawing step. As shown, saw blade 20 is aligned to a singulation region 8. Saw blade 8 is a conventional beveled blade, such as provided by Disco Corporation of Tokyo, Japan, and hence is sometimes referred to herein as beveled blade 20. A beveled blade, as shown in FIG. 2, has a beveled, or angled, cutting surface. In the exemplary illustrated embodiments, the bevel angle is between 30 degrees to 60 degrees, for instance in the illustrated embodiment, the bevel angle is about 45 degrees. Beveled blade 20 cuts into molding compound 18 and leaves therein a kerf 22. Kerf 22 includes an upper region having a relatively vertical sidewall 22a, relative the top major surface of molding compound 18 and an angled sidewall 22b. Using a beveled blade having an bevel angle of about 45 degrees with result in a kerf having an angled sidewall 22b forming an angle of about 45 degrees, relative the top major surface of molding compound 18. For purposes of illustration, kerf 22 is shown much larger than saw blade 20. In actual practice, kerf 22 would be only slightly larger than saw blade 20 in width and other relevant dimensions. The difference in dimensions between kerf 22 and saw blade 20 is greatly exaggerated in the figures.

The conventional wisdom is that the saw blade used to singulate packaged wafers should be a thin as possible in order to reduce mechanical damage to the device (particularly wafer 2) and in order to allow for a thin singulation region. The singulation region is not usable "real estate" on the wafer 2, and hence it is desirable to have a relatively thin singulation region in order to minimize the amount of wafer surface area, or "real estate" taken up by the singulation region. Contrary to conventional wisdom, however, saw blade 20 is significantly wider than a conventional saw blade. In an exemplary embodiment, saw blade 20 has a width w or thickness of 200 microns. Such a saw blade results in a kerf having a width of about or slightly more than about 200 microns. While not being tied to any particular theory, it is believed that the wide kerf reduces the amount of molding compound volume in the region of the singulation. This reduction of volume of molding compound in this region may reduce the impact of mismatch between the coefficient of thermal expansion for molding compound 18, on the one hand, and substrate 2, on the other hand.

As shown in FIG. 2, beveled saw blade 20 saws completely through molding compound 18 and through passivation layer 12 and other non-illustrated layers atop substrate 2 (e.g., inter metal dielectric, or IMD, layers, inter level dielectric, or ILD, layers, and the like). Beveled saw blade further saws through a top portion of substrate 2 but does not saw completely through substrate 2. In other words, a bottom portion of substrate 2 remains after the first sawing operation illustrated in FIG. 2. This bottom portion is, in fact, a substantial portion of the overall thickness of substrate 2. For instance, substrate 2 could be between about 250 microns to about 750 microns in thickness, whereas the top portion sawed through by saw blade 20 may be about 10 microns.

The result of the sawing operation is a cut line, or kerf, extending through molding compound 18 and any layers atop substrate 2, and extending only partly through substrate 2. The kerf, as addressed above, has sidewalls with substantially vertical portions 22a and angled portions 22b, which angled portions extend into the substrate. In exemplary embodiments, saw blade 20 extends about 10 microns into substrate 2. In other embodiments, saw blade 20 extends from about 60 microns to about 200 microns.

FIG. 3 illustrates a next step in the singulation process. As shown, a second saw blade 24 is employed in a second sawing step to complete the singulation process. Second saw blade 24 is aligned to the kerf left by beveled saw blade 20, and is used to saw completely through the remaining bottom portion of substrate 2. In the illustrated embodiment, saw blade 24 is significantly thinner than beveled blade 20. It is not necessary to provide a wide kerf in substrate 2, as such a wide kerf would not provide an advantage in removing the volume of molding compound from the singulation zone. In some embodiments, saw blade 24 is about 30 microns wide. While a beveled blade for saw blade 24 is not outside the scope of the present disclosure, in exemplary embodiments, saw blade 24 is not beveled blade. Likewise, saw blade 24 could be of substantially similar thickness as saw blade 20 in some embodiments.

Figure 4:
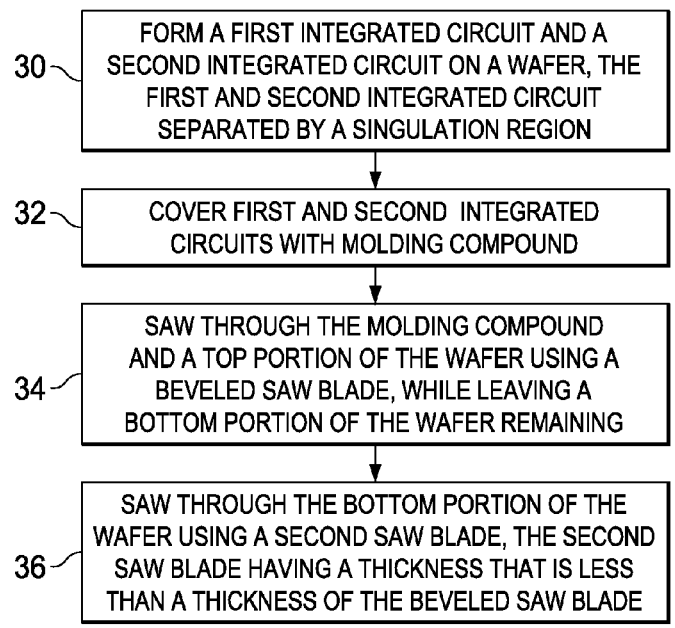
FIG. 4 is a flow chart of an exemplary method of forming a packaged integrated circuit.

FIG. 4 provides a flow chart of an exemplary method of forming a packaged integrated circuit. The method initiates at step 30 which includes forming a first integrated circuit and a second integrated circuit on a wafer, the first and second integrated circuit separated by a singulation region. In step 32, the first and second integrated circuits are covered with a molding compound. Step 34 includes sawing through the molding compound and a top portion of the wafer using a beveled saw blade, while leaving a bottom portion of the wafer remaining. Next, in step 36, the bottom portion of the wafer is sawed through using a second saw blade, the second saw blade having a thickness that is less than a thickness of the beveled saw blade.

Figure 5:
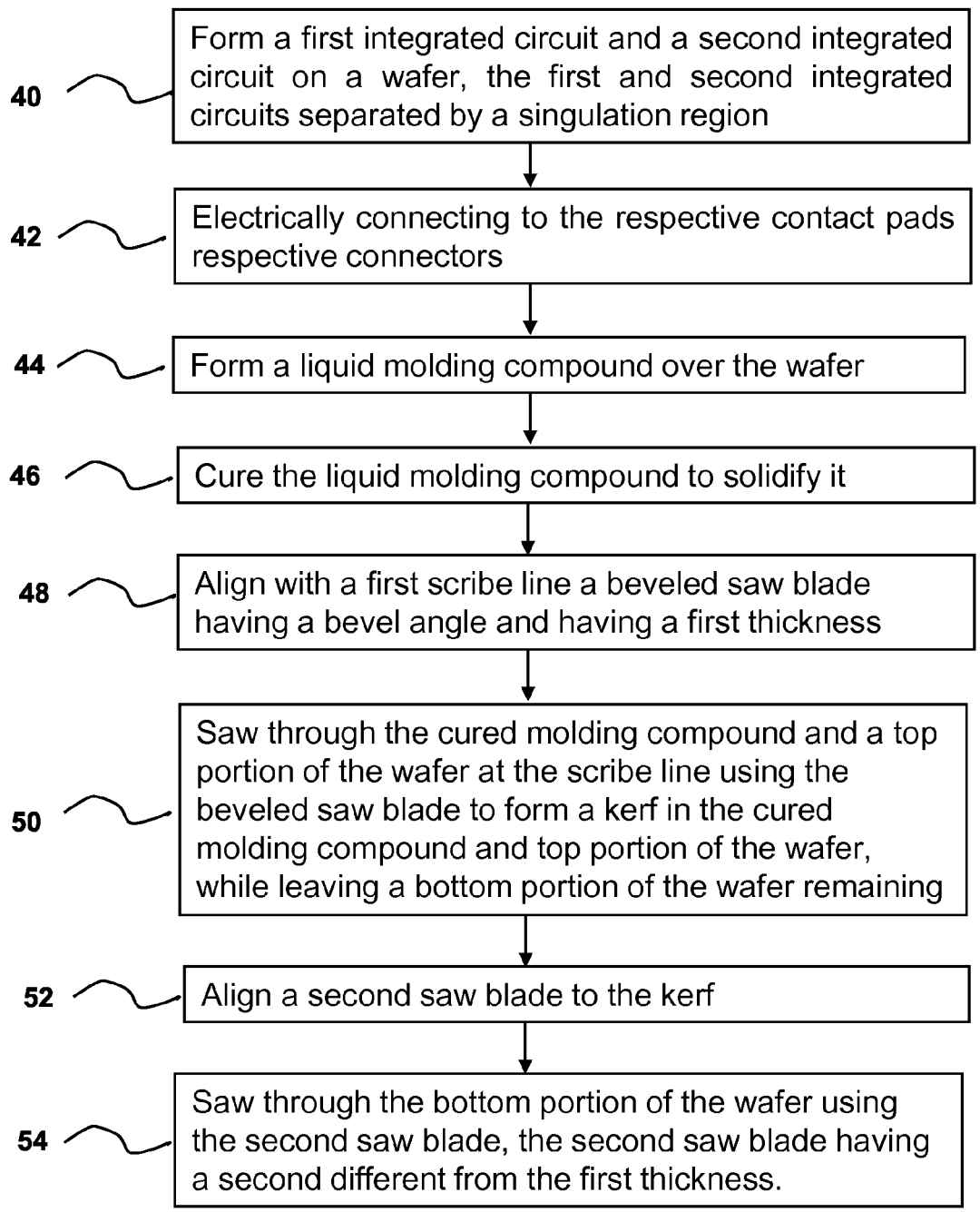
FIG. 5 is a flow chart of another exemplary method of forming a packaged integrated circuit.

FIG. 5 provides a flow chart of another exemplary method of forming a packaged integrated circuit. The method initiates at step 40 which includes providing a wafer having formed thereon a plurality of integrated circuits and a plurality of scribe lines separating adjacent integrated circuits, each integrated circuit including at least one contact pad formed on a top major surface thereof. The method continues with step 42 which includes electrically connecting to the respective contact pads respective connectors. In step 44, a liquid molding compound is formed over the wafer. The liquid molding compound covers the top major surface of the respective integrated circuits and the plurality of scribe lines. In step 46, the liquid molding compound is cured to solidify it. The method continues with step 48 which includes aligning with a first scribe line, a beveled saw blade having a bevel angle of between about 30 degrees and about 60 degrees and having a first thickness. A next step 50 includes sawing through the cured molding compound and a top portion of the wafer at the scribe line using the beveled saw blade to form a kerf in the cured molding compound and top portion of the wafer, while leaving a bottom portion of the wafer remaining. A second saw blade is aligned to the kerf in step 52. Step 54 includes sawing through the bottom portion of the wafer using the second saw blade, the second saw blade having a second different from the first thickness.

The present disclosure has described many exemplary embodiments of singulating packaged integrated circuits. Embodiments in the disclosure are only for illustrative purposes and are not limiting. The processes disclosed may be varied according to needs and the available technology at the time and still within the scope of the disclosure.

What is claimed is:

1. A method of packaging an integrated circuit comprising:
   forming a first integrated circuit and a second integrated circuit on a wafer, the first and second integrated circuits separated by a singulation region;
   forming on a major surface of the first integrated circuit an electrical contact pad;
   forming a solder ball over the electrical contact pad;
   covering the first and second integrated circuits with a molding compound, wherein the molding compound further extends lower than the solder ball;
   sawing through the molding compound and a top portion of the wafer using a beveled saw blade to form a kerf, while leaving a bottom portion of the wafer remaining, wherein a tip of the beveled saw blade comprises:
      a first angled sidewall portion;
      a second angled sidewall portion; and
      a bottom portion connecting the first angled sidewall portion to the second angled sidewall portion, wherein the bottom portion is substantially parallel to a major surface of the wafer when the beveled saw blade is used to saw through the molding compound and the top portion of the wafer;
   wherein the kerf comprises:
      a straight sidewall portion substantially perpendicular to the major surface of the wafer; and
      a third angled sidewall portion disposed at a different angle than the straight sidewall portion, wherein the third angled sidewall portion is connected to the straight sidewall portion at a point, wherein the solder ball extends lower than the point; and
   sawing through the bottom portion of the wafer using a second saw blade.

2. The method of claim 1, wherein the step of sawing through the molding compound and a top portion of the wafer using a beveled saw blade comprises using beveled saw blade having a bevel angle of between about 30 degrees and about 60 degrees.

3. The method of claim 1, wherein covering the first and second integrated circuits with a molding compound comprises:
   depositing a liquid molding compound over the first and second integrated circuits; and
   curing the liquid molding compound.

4. The method of claim 1, wherein covering the first and second integrated circuits with a molding compound comprises forming the molding compound to thickness of from about 80 um to about 120 um.

5. The method of claim 1, wherein the wafer has a thickness of from about 215 to about 245 microns, and wherein the top portion has a thickness of from about 13 to about 16 microns.

6. The method of claim 1, wherein the second saw blade is non-beveled.

7. A method of packaging an integrated circuit comprising:
   forming a first integrated circuit on a wafer and a second integrated circuit on the wafer, the first integrated circuit and the second integrated circuit being separated by a singulation region;
   forming on a first major surface of the first integrated circuit a first electrical contact pad and forming on a second major surface of the second integrated circuit a second electrical contact pad;
   forming a first connector on the first electrical contact pad and a second connector on the second electrical contact pad;
   covering the first major surface and the second major surface with a molding compound, the molding compound extending over the singulation region, wherein a first interface between the first electrical contact pad and the first connector and a second interface between the second electrical contact pad and the second connector are higher than a bottommost surface of the molding compound;
   aligning the wafer to a beveled saw blade so that the beveled saw blade is aligned to the singulation region;
   sawing through the molding compound and a top portion of the wafer in the singulation region with the beveled saw blade to form a kerf, wherein a bottom portion of the wafer remains in the singulation region after the sawing step, and wherein the kerf comprises:
      a straight sidewall substantially perpendicular to the first major surface of the first integrated circuit; and
      an angled sidewall disposed at a different angle than the straight sidewall, wherein the angled sidewall is connected to the straight sidewall at a point higher than a bottom of the first connector; and
   singulating the first integrated circuit and the second integrated circuit by sawing through the bottom portion of the wafer with a second saw blade.

8. The method of claim 7, wherein in the step of sawing through the molding compound and a top portion of the wafer, the beveled saw blade extends at least 10 microns into the wafer.

9. The method of claim 7, wherein the beveled saw blade has a bevel angle of about 45 degrees.

10. The method of claim 7, wherein the first connector is selected from the group consisting of a solder ball, a solder bump, and a copper pillar.

11. The method of claim 7, wherein the step of sawing through the molding compound and a top portion of the wafer in the singulation region results in a kerf having an substantially vertical profile, relative the first major surface, in a top portion of the kerf, and an angled profile in the bottom portion of the kerf.

12. The method of claim 11, wherein the angled profile extends into the wafer.

13. A method of packaging an integrated circuit comprising:
   providing a wafer having formed thereon a plurality of integrated circuits and a plurality of scribe lines separating adjacent integrated circuits, each integrated circuit including at least one contact pad formed on a top major surface thereof;
   electrically connecting respective connectors to the respective contact pads;
   forming a liquid molding compound over the wafer, the liquid molding compound covering the top major surface of the respective integrated circuits and the plurality of scribe lines, wherein the liquid molding compound further extends along a sidewall of the at least one contact pad;
   curing the liquid molding compound to solidify it;
   aligning with a first scribe line, a beveled saw blade;
   sawing through the cured molding compound and a top portion of the wafer at the scribe line using the beveled saw blade to form a kerf in the cured molding compound and the top portion of the wafer while leaving a bottom portion of the wafer remaining, wherein the kerf comprises:

a first sidewall substantially perpendicular to the top major surface;
a second sidewall disposed at a different angle than the first sidewall, wherein the second sidewall intersects the first sidewall at a joint, and wherein the joint is higher than bottoms of the connectors; and
a substantially level bottom surface;
aligning a second saw blade to the kerf; and
sawing through the bottom portion of the wafer using the second saw blade.

14. The method of claim 13, wherein electrically connecting to the respective contact pads respective connectors comprises:
forming a passivation layer over the contact pads;
forming a patterned redistribution layer over the passivation layer, portions of the patterned redistribution layer being in electrical contact with respective ones of the contact pads; and
forming respective solder balls on respective portions of the patterned redistribution layer, wherein the joint is higher than bottoms of the solder balls.

15. The method of claim 14, wherein the solder balls are formed directly on and in physical contact with the patterned redistribution layer.

16. The method of claim 13, wherein in the step of sawing through the cured molding compound and a top portion of the wafer, the beveled saw blade extends into the wafer by about 60 microns to about 200 microns.

17. The method of claim 13, wherein the beveled saw blade has a bevel angle of between about 30 degrees and about 60 degrees.

18. The method of claim 1, wherein the second saw blade has a beveled blade.

19. The method of claim 7, wherein the beveled saw blade extends about 10 microns into the wafer in the step of sawing through the molding compound and a top portion of the wafer.

20. The method of claim 1, wherein the beveled saw blade has a thickness of about 200 microns and the second saw blade having a thickness of about 30 microns.

* * * * *